United States Patent
Kawahata et al.

(10) Patent No.: US 9,350,073 B2
(45) Date of Patent: May 24, 2016

(54) MEMS MODULE, VARIABLE REACTANCE CIRCUIT AND ANTENNA DEVICE

(71) Applicant: MURATA MANUFACTURING CO., LTD., Kyoto (JP)

(72) Inventors: Kazunari Kawahata, Kyoto (JP); Hiroshi Nishida, Kyoto (JP); Hiroshi Nishikawa, Kyoto (JP); Toshiya Kawate, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 219 days.

(21) Appl. No.: 13/937,026

(22) Filed: Jul. 8, 2013

(65) Prior Publication Data

US 2013/0293432 A1 Nov. 7, 2013

Related U.S. Application Data

(63) Continuation of application No. PCT/JP2012/050766, filed on Jan. 17, 2012.

(30) Foreign Application Priority Data

Jan. 19, 2011 (JP) ................................. 2011-008342

(51) Int. Cl.
*H01Q 1/50* (2006.01)
*H01Q 5/00* (2015.01)
(Continued)

(52) U.S. Cl.
CPC .. *H01Q 1/50* (2013.01); *B81B 7/02* (2013.01); *H01Q 5/321* (2015.01); *H01Q 5/335* (2015.01); *H04B 1/0458* (2013.01); *H04W 52/0209* (2013.01)

(58) Field of Classification Search
CPC ........... H01Q 5/321; H01Q 1/50; H01Q 5/30; H01Q 5/307; H01Q 5/314; H01Q 5/335; H01Q 5/50; H04B 1/0458; B81B 7/02
USPC .................. 343/745, 850, 852, 853, 860, 861
See application file for complete search history.

(56) References Cited

U.S. PATENT DOCUMENTS 6,798,321 B2 * 9/2004 Hallbjorner ........ H01H 59/0009
200/181
7,375,695 B2 * 5/2008 Ishizuka et al. ............... 343/745
(Continued)

FOREIGN PATENT DOCUMENTS

JP 2006-294866 A 10/2006
JP 2007-242607 A 9/2007
(Continued)

OTHER PUBLICATIONS

An Office Action; "Notification of Reasons for Rejection," issued by the Japanese Patent Office on May 13, 2014, which corresponds to Japanese Patent Application No. 2012-553719 and is related to U.S. Appl. No. 13/937,026; with English language translation.
(Continued)

*Primary Examiner* — Sue A Purvis
*Assistant Examiner* — Patrick Holecek
(74) *Attorney, Agent, or Firm* — Studebaker & Brackett PC

(57) ABSTRACT

Provided is a MEMS module that includes a MEMS element having a first capacitor electrode that can be displaced, a second capacitor electrode that opposes the first capacitor electrode, and driving electrodes that cause the first capacitor electrode to be displaced. The driving electrodes are connected to a control unit that applies a driving voltage to the driving electrodes and monitor terminals for detecting power. Thus, an element for monitoring power is not needed and a MEMS module, a variable reactance circuit and an antenna device are provided that are capable of realizing smaller size and lower loss.

20 Claims, 3 Drawing Sheets

(51) Int. Cl.
*H01Q 5/321* (2015.01)
*H04B 1/04* (2006.01)
*B81B 7/02* (2006.01)
*H04W 52/02* (2009.01)
*H01Q 5/335* (2015.01)

(56) References Cited

U.S. PATENT DOCUMENTS

| | | | |
|---|---|---|---|
| 7,663,555 B2 * | 2/2010 | Caimi et al. | 343/702 |
| 2006/0226735 A1 | 10/2006 | Ikehashi | |
| 2007/0281646 A1 * | 12/2007 | Itaya et al. | 455/197.2 |
| 2007/0285326 A1 * | 12/2007 | McKinzie | H01Q 9/0407 343/746 |
| 2008/0026709 A1 | 1/2008 | Liu et al. | |
| 2010/0246087 A1 | 9/2010 | Ikehashi et al. | |
| 2011/0109383 A1 * | 5/2011 | Lan | H01P 1/127 327/574 |

FOREIGN PATENT DOCUMENTS

| | | |
|---|---|---|
| JP | 2007-324336 A | 12/2007 |
| JP | 2009-545240 A | 12/2009 |
| JP | 2010-135634 A | 6/2010 |
| JP | 2010-192969 A | 9/2010 |
| WO | 2010/113353 A1 | 10/2010 |
| WO | 2010/140406 A1 | 12/2010 |

OTHER PUBLICATIONS

International Search Report; PCT/JP2012/050766; Apr. 17, 2012.
Written Opinion of the International Search Authority; PCT/JP2012/050766; Apr. 17, 2012.

* cited by examiner

MEMS MODULE, VARIABLE REACTANCE CIRCUIT AND ANTENNA DEVICE

CROSS REFERENCE TO RELATED APPLICATIONS

The present application is a continuation of International Application No. PCT/JP2012/050766 filed on Jan. 17, 2012, and claims priority to Japanese Patent Application No. 2011-8342 filed on Jan. 19, 2011, the entire contents of each of these applications being incorporated herein by reference in their entirety.

TECHNICAL FIELD

The technical field is related to a MEMS module connected to an antenna and to a variable reactance circuit and an antenna device including such a MEMS module.

BACKGROUND

In general, in wireless communication devices such as cellular phones, a method for reducing the power consumption of a transmission-side power amplifier by controlling the power used at the time of transmission may be used in a radio frequency (RF) circuit. As an example of such a method, there is a method in which a directional coupler is connected between a transmission-side power amplifier and an antenna, power is detected by extracting part of a transmission signal output from the transmission-side power amplifier by using the directional coupler and the detected power is fed back to a control unit that controls the transmission-side power amplifier so that the magnitude of the power remains constant.

FIG. 1 illustrates the configuration of an antenna device described in Japanese Unexamined Patent Application Publication No. 5-291854 (Patent Document 1). As illustrated in FIG. 1, the antenna device described in Patent Document 1 includes a transmission-side power amplifier 201, a directional coupler 202, an impedance converter 203, a detector circuit 204, an error voltage amplifier 205 and a bias circuit 206. The directional coupler 202 is connected between the transmission-side power amplifier 201 and an antenna. In the antenna device described in Patent Document 1, a transmission signal, which is an input RF signal, is input to the transmission-side power amplifier 201 and is then amplified and output by the transmission-side power amplifier 201. At this time, part of the transmission signal output from the transmission-side power amplifier 201 is extracted by the directional coupler 202. The transmission signal extracted by the directional coupler 202 has a bias voltage superposed thereon by the bias circuit 206 and is then input to the impedance converter 203. The bias voltage superposed by the bias circuit 206 is for correcting the forward voltage drop of a diode of the detector circuit 204. The impedance converter 203 is configured so that its output impedance is larger than its input impedance and therefore the voltage of a signal output from the impedance converter 203 is higher than the voltage of a signal input to the impedance converter 203. A signal output from the impedance converter 203 is detected by the detector circuit 204. The signal output from the detector circuit 204 is input to the error voltage amplifier 205 together with a signal output from a level control voltage generator based on data corresponding to an instructed power level from a base station stored in a ROM. The error voltage amplifier 205 amplifies and outputs a difference between the two signals input thereto and a signal output from the error voltage amplifier 205 is fed back to a control unit that controls the amplification ratio of the transmission-side power amplifier 201.

SUMMARY

The present disclosure provides a MEMS module, a variable reactance circuit, and an antenna device that can realize smaller size and lower loss by making an element for monitoring power such as a directional coupler unnecessary.

In one aspect of the present disclosure, a MEMS module includes a MEMS element including a first capacitor electrode that can be displaced, a second capacitor electrode that opposes the first capacitor electrode, and a driving electrode that causes the first capacitor electrode to be displaced. The driving electrode is connected to a control unit that applies a driving voltage to the driving electrode and a monitor terminal for detecting power.

In a more specific embodiment, a MEMS module according to the present disclosure preferably further includes at least one of a capacitor and an inductor connected in parallel with the MEMS element.

In another aspect of the present disclosure, a variable reactance circuit includes the above MEMS module, a feeder circuit to which the first capacitor electrode is connected, and a radiating element to which the second capacitor electrode is connected. A reactance between the feeder circuit and the radiating element is changed by causing the first capacitor electrode to be displaced.

In yet another aspect of the present disclosure, an antenna device includes the above variable reactance circuit and performs communication in different frequency bands. The antenna device includes a first radiating element that is connected to the feeder circuit and is used in a first frequency band, and a second radiating element a radiating element to which the second capacitor electrode is connected and connected to the feeder circuit via the variable reactance circuit and is used in a second frequency band located a lower frequency than the first frequency band.

In another more specific embodiment, the above antenna device including the variable reactance circuit may include another radiating element that is connected to the feeder circuit and the variable reactance circuit.

DETAILED DESCRIPTION

The inventors realized that in the antenna device described in Patent Document 1, a directional coupler 202 is used and there is a problem in that a large mounting area is necessary when mounting the directional coupler 202 in an RF circuit and size reduction of the RF circuit cannot be realized. In addition, there is also a problem that signal loss is caused by the directional coupler.

Also, in recent years, in wireless communication devices such as cellular phones, multiband communication technology in which communication is performed in a plurality of frequency bands has been progressing. There is a demand for an antenna device mounted in a multiband wireless communication device to be compatible with a plurality of frequency bands. Accordingly, the present inventors studied use of micro electromechanical systems (MEMS) variable capacitance element in an antenna device, the MEMS variable capacitance element having excellent linearity in the range of variation of variable capacitance compared with, for example, a variable capacitance diode. The inventors further found that the above-mentioned directional coupler could be omitted by using the MEMS variable capacitance element.

Hereafter, preferred embodiments of a MEMS module, a variable reactance circuit and an antenna device according to the present disclosure will be described with reference to the drawings.

An antenna device according to the present disclosure may perform communication using the global system for mobile communications (GSM) (registered trademark) scheme, the wideband code division multiple access (W-CDMA) scheme or any other scheme, or other than these schemes may perform communication in which various schemes are used in combination such as in long term evolution (LTE). Hereafter, description will be given of an antenna device that is capable of performing communication in a low frequency band (hereafter, "low band" or "low-band") and in a high-frequency band (hereafter, "high band" or "high-band").

Figure 1:
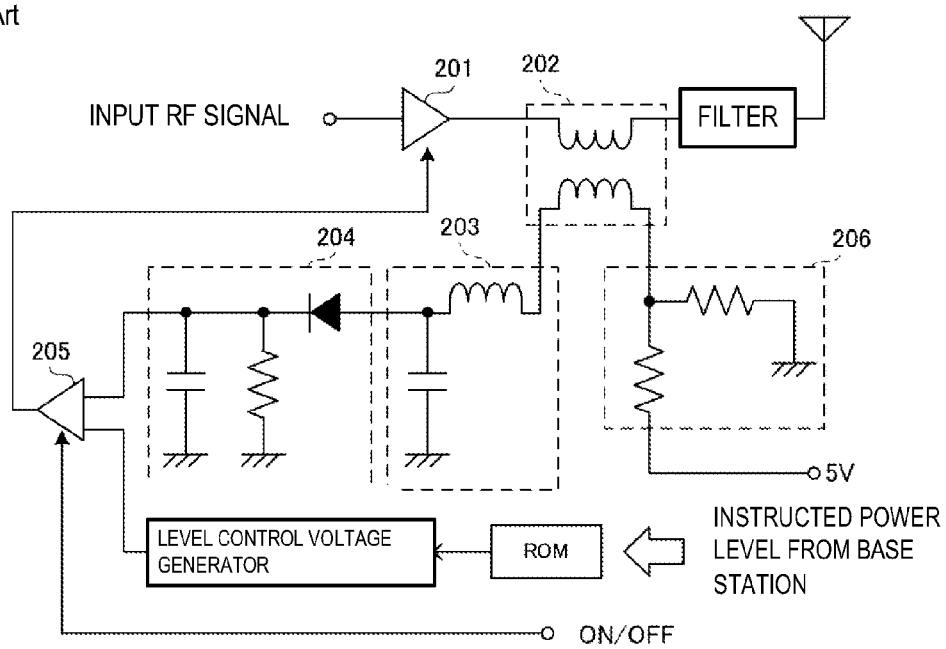
FIG. 1 illustrates the configuration of an antenna device described in Patent Document 1.
Figure 2:
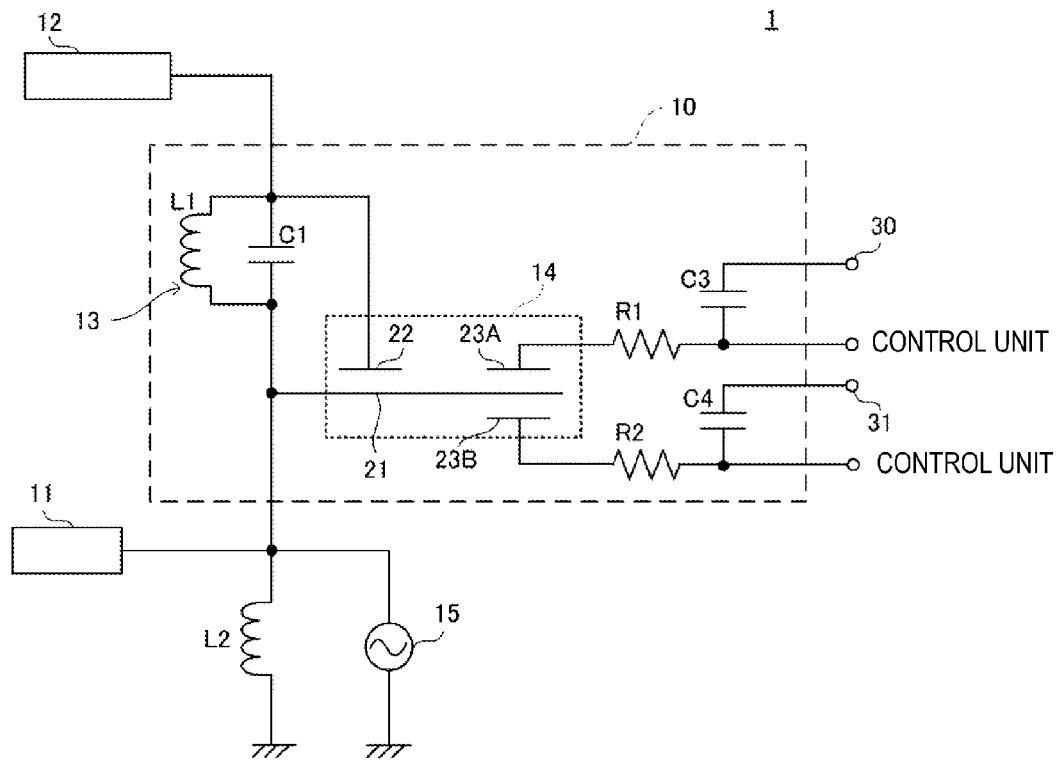
FIG. 2 schematically illustrates the circuit configuration of an antenna device according to exemplary embodiment 1.

FIG. 2 schematically illustrates the circuit configuration of an antenna device according to an exemplary embodiment 1. An antenna device 1 according to this embodiment is capable of performing communication in a first frequency band and a second frequency band located on a lower frequency than the first frequency band. The first frequency band is a high band and the second frequency band is a low band. The antenna device 1 includes a first radiating element 11 for high-band communication, a second radiating element 12 for low-band communication, a radio-frequency micro electromechanical systems (RF-MEMS) module 10 and a feeder circuit 15. The RF-MEMS module 10 is a MEMS module. The first radiating element 11 and the second radiating element 12 are electrodes formed on, for example, a printed circuit board or a dielectric substrate. The first radiating element 11 has such a length as to mainly operate at a high-band frequency $f_H$ (1.7 GHz in this embodiment). The second radiating element 12 has such a length as to mainly operate at a low-band frequency $f_L$ (800 MHz in this embodiment).

The antenna device 1 is equipped with the first radiating element 11 and the second radiating element 12, and as a result, a resonant state (valley in return loss characteristics) is generated in two frequency bands, that is, the high band centered on 1.7 GHz and the low band centered on 800 MHz.

One end of the first radiating element 11 is open and the other end is connected to the feeder circuit 15. The other end of the first radiating element 11 may be connected to the feeder circuit 15 via a capacitance. One end of the second radiating element 12 is open and the other end is connected to the feeder circuit 15 via the RF-MEMS module 10 serving as a variable capacitance circuit. The RF-MEMS module 10 will be described in detail hereafter.

The feeder circuit 15 is connected to a transmission and reception circuit (RF circuit), which is not illustrated, which allows the antenna device 1 to perform communication in the low band and the high band via the first radiating element 11 and the second radiating element 12. The feeder circuit 15 is, for example, equipped with a power amplifier that amplifies the voltage of a transmission signal necessary in communication.

An inductor L2 used for matching, one end of which is connected to ground, is connected between the RF-MEMS module 10 and the feeder circuit 15 and between the first radiating element 11 and the feeder circuit 15. The inductor L2 is an element that is mainly used for matching of the first radiating element 11 and the second radiating element 12.

Therefore, one end of the first radiating element 11 is open and the other end is connected to the feeder circuit 15 and the inductor L2. In addition, one end of the second radiating element 12 is open and the other end is connected to the feeder circuit 15 and the inductor L2 via the RF-MEMS module 10.

The RF-MEMS module 10 functions as a frequency variable circuit (variable reactance circuit) in the antenna device 1 and is equipped with a tank circuit 13 that includes a MEMS element 14. The tank circuit 13 is an LC parallel resonance circuit in which an inductor L1, a capacitor C1 and the MEMS element 14 are connected in parallel with one another and that is formed so as to have high impedance in the first frequency band (i.e., the high band) and a reactance property in the second frequency band (i.e., the low band).

The constants of the inductor L1 and the capacitor C1 of the tank circuit 13 are set so that the parallel resonant frequency of the circuit formed by the inductor L1, the capacitor C1 and the MEMS element 14 is within the high band. In addition, the tank circuit 13 is designed so as to be coupled with the first radiating element 11 and so that a harmonic of the second radiating element 12 is excited, whereby matching can also be obtained at frequencies in the vicinity of three times (e.g., approximately 2.3 to 2.5 GHz) that of the low band (e.g., 800 MHz band).

Figure 3:
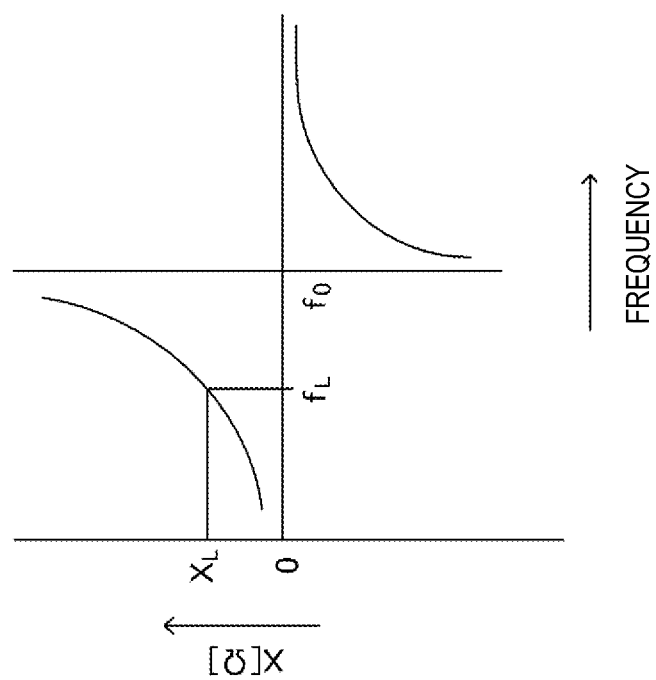
FIG. 3 illustrates the frequency characteristics of the reactance of an LC parallel resonance circuit in the antenna device according to embodiment 1.

FIG. 3 illustrates the frequency characteristics of the reactance of the LC parallel resonance circuit in which the inductor L1, the capacitor C1 and the MEMS element 14 are connected in parallel with each other in the antenna device 1 according to embodiment 1. In FIG. 3, the horizontal axis represents the frequency of a supply voltage applied to the LC parallel resonance circuit and the vertical axis represents the reactance X of the LC parallel resonance circuit. As illustrated in FIG. 3, the impedance is maximum at a resonant frequency $f_0$ of the LC parallel resonance circuit and the LC parallel resonance circuit has an inductive property in a frequency range lower than the resonant frequency $f_0$.

Therefore, by setting the parallel resonant frequency to the frequency $f_H$, the tank circuit 13 can prevent a signal with the frequency $f_H$ handled in high-band communication from flowing to the second radiating element 12. Thus, coupling of the first radiating element 11 and the second radiating element 12 can be suppressed. In addition, in the antenna device 1, in the case where communication is performed in the high band, a signal with the frequency $f_H$ does not flow to the tank circuit 13 and therefore high-frequency loss due to the tank circuit 13 is reduced.

In addition, as well as the resonant frequency of the tank circuit 13 being set to the frequency $f_H$ as described above, a constant of the tank circuit 13 (in the case of FIG. 3, inductance XL) is set so that a signal of frequency $f_L$ handled in low-band communication passes through the tank circuit 13. The tank circuit 13 has an inductive property at the frequency $f_L$ which is lower than the resonant frequency $f_0$ set to the frequency $f_H$. Thus, in the antenna device 1, in the case of communication in the low band, a signal with the frequency $f_L$ handled in low-band communication is not stopped by the tank circuit 13 and communication in the low band is possible.

In addition, a signal with the frequency $f_L$ passes through the inductive tank circuit 13 and therefore the wavelength shortening occurs due to the inductance. As a result, the antenna device 1 can be reduced in size by the amount by which the wavelength is shortened by the wavelength shortening effect.

As described above, through operation of the tank circuit 13, the antenna device 1 according to this embodiment obtains two resonant states in the low band and the high band and communication is possible in the low band and the high band without switching the communication frequency band.

In addition, since the tank circuit 13 does not allow a signal with the frequency $f_H$ to pass therethrough, the antenna device 1 according to this embodiment can reduce high-frequency loss in communication in the high band, and as a result, can suppress deterioration of the antenna characteristics.

Figure 4:
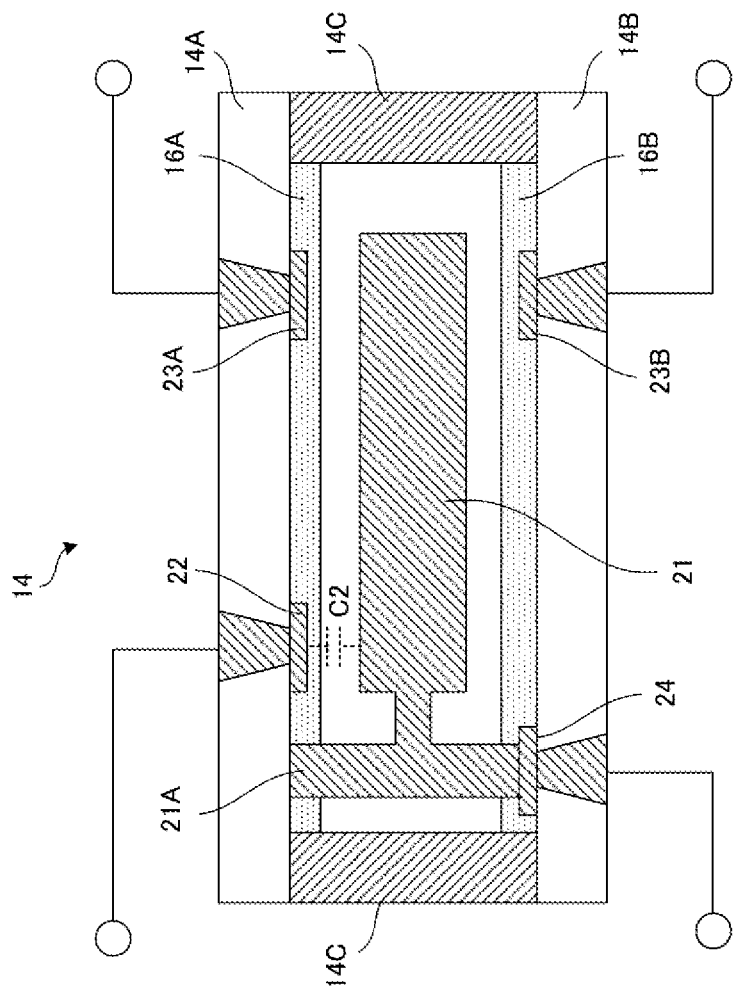
FIG. 4 is a schematic sectional view of a MEMS element in the antenna device according to embodiment 1.

The MEMS element 14 included in the tank circuit 13 is a variable capacitance element and the RF capacitance thereof can be changed to a desired value in accordance with the magnitude of an applied bias voltage (i.e., driving voltage). FIG. 4 is a schematic sectional view of the MEMS element 14 of the antenna device 1 according to exemplary embodiment 1. The MEMS element 14 includes an upper substrate 14A, a lower substrate 14B and a sealing frame 14C. The upper substrate 14A and the lower substrate 14B can be composed of glass. The sealing frame 14C can be composed of silicone and is disposed between the upper substrate 14A and the lower substrate 14B.

The MEMS element 14 includes an plate-shaped movable body (movable electrode) 21, which has flexibility, and an anchor portion 21A that supports the movable body 21 in an inner space formed by the upper substrate 14A, the lower substrate 14B, and the sealing frame 14C. The movable body 21 can be displaced and is a first capacitor electrode. The movable body 21 and the anchor portion 21A can be composed of a metal such as Cu. The anchor portion 21A is provided so as to be interposed between the upper substrate 14A and the lower substrate 14B. The movable body 21 is supported by the anchor portion 21A in a state of being separated from the upper substrate 14A and the lower substrate 14B.

A capacitor electrode 22 and a driving electrode 23A are formed on a surface of the upper substrate 14A that is on the inner space side. The capacitor electrode 22 is a second capacitor electrode. The capacitor electrode 22 and the driving electrode 23A are covered by an insulating film 16A. A connection electrode 24 and a driving electrode 23B are formed on a surface of the lower substrate 14B on the inner space side. The connection electrode 24 and the driving electrode 23B are covered by an insulating film 16B.

The driving electrode 23A and the driving electrode 23B are arranged so as to oppose each other and the movable body 21 is arranged between the two electrodes 23A, 23B. In addition, the capacitor electrode 22 is arranged so as to oppose the movable body 21. An electrostatic capacitance formed between the movable body 21 and the capacitor electrode 22 forms a capacitor C2, as indicated by dotted line in FIG. 4. The capacitance of the capacitor C2 changes in accordance with the distance between the movable body 21 and the capacitor electrode 22. That is, the capacitor C2 is a variable capacitor, which is an RF capacitor. The connection electrode 24 is electrically connected to the anchor portion 21A and is connected to the first radiating element 11, the inductor L2, and the feeder circuit 15 illustrated in FIG. 2.

As illustrated in FIG. 2, the driving electrode 23A is connected to the control unit, which is not illustrated, via a resistor R1. In addition, the driving electrode 23B is connected to the control unit, which is not illustrated, via a resistor R2. A driving voltage (bias voltage) for generating electrostatic attraction with the movable body 21 is applied by the not-illustrated control unit to the driving electrode 23A and the driving electrode 23B.

When the driving voltage is applied to the driving electrode 23A, the movable body 21 bends toward the upper substrate 14A side due to the electrostatic attraction generated between the driving electrode 23A and the movable body 21. Thus, the movable body 21 comes closer to the capacitor electrode 22 and the capacitance of the capacitor C2 formed between the movable body 21 and the capacitor electrode 22 becomes larger (i.e., increases).

When the driving voltage is applied to the driving electrode 23B, the movable body 21 bends toward the lower substrate 14B side due to the electrostatic attraction generated between the driving electrode 23B and the movable body 21. Thus, the movable body 21 moves away from the capacitor electrode 22 and the capacitance of the capacitor C2 formed between the movable body 21 and the capacitor electrode 22 becomes smaller (i.e., decreases).

The capacitor electrode 22 is connected to the second radiating element 12 and the movable body 21 is connected to the feeder circuit 15. That is, the tank circuit 13 is equivalent to a configuration in which the inductor L1, the capacitor C1, and a capacitor C2, which is a variable capacitor, are connected in parallel with each other.

In the RF-MEMS module 10, the center frequency of the low band can be shifted toward the higher frequency side or a lower frequency than the frequency $f_L$ (800 MHz) by causing the capacitance of the capacitor C2 in the MEMS element 14 to change.

More specifically, the constants of the inductor L1 and the capacitor C1 of the tank circuit 13 are set such that the parallel resonant frequency of the tank circuit 13 is within the high band (for example, 1.71 to 1.88 GHz) and such that there is an inductive property in the low band. In this case, by causing the capacitance of the capacitor C2 connected in parallel with the capacitor C1 to change, the reactance of the tank circuit 13 can be caused to change and the resonant frequency of the second radiating element 12 can be caused to change to a predetermined frequency. Therefore, the RF-MEMS module 10 forms a frequency variable circuit in the antenna device 1. In other words, the RF-MEMS module 10 forms a variable reactance circuit in the antenna device 1.

In addition, the driving electrode 23A is connected to a first monitor terminal 30 via the resistor R1 and a capacitor C3. The driving electrode 23B is connected to a second monitor terminal 31 via the resistor R2 and a capacitor C4. The capacitors C3 and C4 stop the driving voltage applied to the driving electrodes 23A and 23B from being applied to the first monitor terminal 30 and the second monitor terminal 31. In addition, the capacitors C3 and C4 function as filters that remove unnecessary frequency components.

Part of a signal output from the feeder circuit 15 to the first radiating element 11 or the second radiating element 12 is input to the movable body 21. The part of the signal that is input to the movable body 21 passes through the capacitor formed between the movable body 21 and the driving electrode 23A and flows to the first monitor terminal 30 via the resistor R1 and the capacitor C3. In addition, the part of the signal that is input to the movable body 21 passes through the capacitor formed between the movable body 21 and the driving electrode 23B and flows to the second monitor terminal 31 via the resistor R2 and the capacitor C4.

As has been described above, the power consumption of a power amplifier can be reduced by subjecting the power amplifier to feedback control. In the antenna device 1 according to embodiment 1 of the present invention, the signal level (power) of a communication signal output from the feeder circuit 15 to the first radiating element 11 or the second radiating element 12 can be detected by detecting the signal level (power) of the communication signal from the first monitor terminal 30 or the second monitor terminal 31. The result of the detection is fed back to the transmission and reception circuit connected to the feeder circuit 15, whereby the transmission-side power amplifier can be used in a state in which power efficiency is very high and power consumption of the transmission-side power amplifier can be reduced.

As a monitor terminal for detecting a signal level (power), only one of the first monitor terminal 30 and the second monitor terminal 31 need be provided. In addition, since the signal flowing to the first monitor terminal 30 and the signal flowing to the second monitor terminal 31 differ due to the capacitance of the capacitor formed between the movable body 21 and the driving electrode 23A and the capacitance of the capacitor formed between the movable body 21 and the driving electrode 23B, one of the first monitor terminal 30 and the second monitor terminal 31 may be used as a monitor terminal for the high band and the other may be used as a monitor terminal for the low band depending on which of the driving electrode 23A and 23B the driving voltage is applied to.

Thus, as a result of using the MEMS element 14 in the antenna device 1 according to this embodiment, there is no need for a separate special element such as a directional coupler for monitoring power in contrast to the antenna device of the related art in which a directional coupler is provided. Thus, in the antenna device 1, the number of components can be reduced and a reduction in size can be achieved. In addition, in the antenna device 1 according to this embodiment, since no special element for monitoring power such as a directional coupler is provided, signal loss due to such an element does not occur and a reduction of loss can be achieved.

In the above-described embodiment, as a result of using the RF-MEMS module 10, which functions as a frequency variable circuit, there is no need for an element for monitoring power such as a directional coupler, and even in the case where the RF-MEMS module 10 is used in a phase shifter of an antenna device, it is possible to eliminate the need for an element for monitoring the power.

Figure 5:
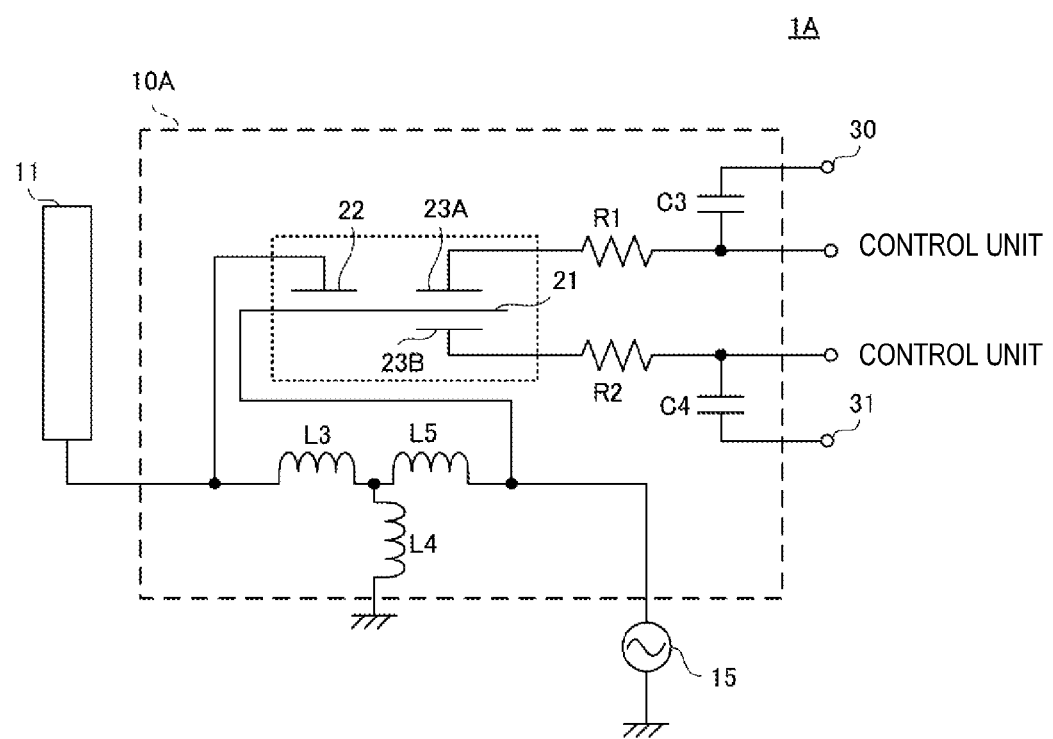
FIG. 5 schematically illustrates the circuit configuration of an antenna device according to exemplary embodiment 2.

FIG. 5 schematically illustrates the circuit configuration of an antenna device 1A according to an exemplary embodiment 2. A phase shifter of an antenna device 1A according to this embodiment is formed of an RF-MEMS module 10A. In embodiment 2, constituent elements that have the same functions as those of embodiment 1 are denoted by the same reference symbols. The antenna device 1A illustrated in FIG. 5 is equipped with only the first radiating element 11 for high-band communication. The first radiating element 11 is connected to the feeder circuit 15 via inductors L3, L4 and L5 forming a matching circuit. In addition, the first radiating element 11 is connected to the feeder circuit 15 via the RF-MEMS module 10A.

In this configuration, the power can be monitored with the first monitor terminal 30 and the second monitor terminal 31 by using the RF-MEMS module 10A in a phase shifter without providing a special element such as a directional coupler similarly to as in Embodiment 1.

In embodiments of a MEMS module according to the present disclosure, a driving voltage can be applied to the driving electrode from the control unit and the first capacitor electrode is caused to be displaced, whereby the capacitance of the capacitor formed between the first capacitor electrode and the second capacitor electrode can be changed. In addition, the driving electrode is connected to the monitor terminal for detecting power, and as a result a signal flowing between the first capacitor electrode and the second capacitor electrode can be monitored from the monitor terminal.

The signal flowing between the first capacitor electrode and the second capacitor electrode is monitored from the monitor terminal and a result of the monitoring is for example fed back to an amplifier that amplifies the signal and thereby the signal level of the signal can be adjusted to an appropriate value.

In embodiments of a variable reactance circuit in accordance with the present disclosure, since a signal flowing between the first capacitor electrode and the second capacitor electrode can be monitored from the monitor terminal, a result of the monitoring is for example fed back to an amplifier that amplifies the signal and thereby the power radiated from the radiating element can be adjusted to an appropriate value.

In embodiments of an antenna device according to the present disclosure, as a result of providing the variable reactance circuit, a tunable antenna device or a shiftable antenna device can be realized. In addition, the power radiated from the radiating element can be adjusted to an appropriate value and therefore a directional coupler such as in the related art is not needed and a compact broad-band antenna configuration can be realized.

In embodiments according to the present disclosure, an element for monitoring power such as a directional coupler is not needed and size and loss reduction can be realized.

That which is claimed is:

1. A MEMS module comprising:
 a MEMS element comprising:
  a first capacitor electrode that can be displaced;
  a second capacitor electrode that opposes the first capacitor electrode; and
  a driving electrode that causes the first capacitor electrode to be displaced,
 wherein the driving electrode is electrically connected to both a control unit that applies a driving voltage to the driving electrode and a monitor terminal for detecting power, and
 the driving electrode is capacitively coupled to the monitor terminal while the driving electrode has a direct voltage coupling to the control unit.

2. The MEMS module according to claim 1, further comprising at least one of a capacitor and an inductor connected in parallel with the MEMS element.

3. A variable reactance circuit comprising:
 the MEMS module according to claim 1;
 a feeder circuit to which the first capacitor electrode is connected; and
 a radiating element to which the second capacitor electrode is connected,
 wherein reactance between the feeder circuit and the radiating element is changed by causing the first capacitor electrode to be displaced.

4. An antenna device that includes the variable reactance circuit according to claim 3 and performs communication in different frequency bands, the antenna device comprising:
 a first radiating element that is connected to the feeder circuit and is used in a first frequency band; and
 a second radiating element comprising the radiating element to which the second capacitor electrode is connected and connected to the feeder circuit via the variable reactance circuit and is used in a second frequency band located at a lower frequency than the first frequency band.

5. An antenna device including the variable reactance circuit according to claim 3, comprising:
another radiating element that is connected to the feeder circuit and the variable reactance circuit.

6. A variable reactance circuit comprising:
the MEMS module according to claim 2;
a feeder circuit to which the first capacitor electrode is connected; and
a radiating element to which the second capacitor electrode is connected,
wherein reactance between the feeder circuit and the radiating element is changed by causing the first capacitor electrode to be displaced.

7. An antenna device that includes the variable reactance circuit according to claim 6 and performs communication in different frequency bands, the antenna device comprising:
a first radiating element that is connected to the feeder circuit and is used in a first frequency band; and
a second radiating element comprising the radiating element to which the second capacitor electrode is connected and connected to the feeder circuit via the variable reactance circuit and is used in a second frequency band located at a lower frequency than the first frequency band.

8. An antenna device including the variable reactance circuit according to claim 6, comprising:
another radiating element that is connected to the feeder circuit and the variable reactance circuit.

9. The MEMS module according to Claim 1, wherein the driving electrode is resistively coupled to the control unit.

10. The MEMS module according to claim 1, wherein the driving electrode displaces the first capacitor electrode using an electrostatic attraction.

11. The MEMS module according to claim 1, further comprising:
a second driving electrode electrically connected to the control unit, wherein both driving electrodes are controlled to differentially displace the first capacitor electrode using electrostatic force.

12. The MEMS module according to claim 11, wherein both of the driving electrodes are capacitively coupled to the monitor terminal.

13. The MEMS module according to claim 11, wherein part of energy provided by a feeder circuit to the first capacitor electrode is provided to the second capacitor electrode while another part of the energy is provided to both driving electrodes.

14. The MEMS module according to claim 1, wherein the first capacitor electrode consists of a single metal body and has an integrally-formed anchor portion upon which the single metal body is angularly displaced.

15. The MEMS module according to claim 14, wherein the second capacitor electrode is closer to the anchor portion than the driving electrode.

16. The MEMS module according to claim 12, wherein part of energy provided by a feeder circuit to the first capacitor electrode is provided to the second capacitor electrode while another part of the energy is provided to the driving electrode.

17. A MEMS module comprising:
a MEMS element comprising:
a first capacitor electrode that can be displaced;
a second capacitor electrode that opposes the first capacitor electrode; and
a first driving electrode that causes the first capacitor electrode to be displaced,
wherein the first driving electrode is electrically connected to both a control unit that applies a driving voltage to the first driving electrode and a monitor terminal for detecting power, and
a second driving electrode electrically connected to the control unit,
wherein both the first and the second driving electrodes are controlled to differentially displace the first capacitor electrode using electrostatic force, and both the first and the second driving electrodes are capacitively coupled to the monitor terminal.

18. The MEMS module according to claim 17, wherein part of energy provided by a feeder circuit to the first capacitor electrode is provided to the second capacitor electrode while another part of the energy is provided to both the first and the second driving electrodes.

19. The MEMS module according to claim 17, wherein the first capacitor electrode consists of a single metal body and has an integrally-formed anchor portion upon which the single metal body is angularly displaced, and wherein the second capacitor electrode is closer to the anchor portion than the first driving electrode.

20. The MEMS module according to claim 17, wherein part of energy provided by a feeder circuit to the first capacitor electrode is provided to the second capacitor electrode while another part of the energy is provided to the first driving electrode.

* * * * *